United States Patent
Rougeot et al.

(10) Patent No.: US 6,982,425 B1
(45) Date of Patent: Jan. 3, 2006

(54) INDIRECT X-RAY IMAGE DETECTOR FOR RADIOLOGY

(75) Inventors: Henri M. Rougeot, Beaconsfield (CA); Alain Jean, Boston, MA (US); Habib Mani, Montreal-West (CA); Ziad Aziz Shukri, Verdun (CA)

(73) Assignee: FTNI Inc., Montreal (CA)

( * ) Notice: Subject to any disclaimer, the term of this patent is extended or adjusted under 35 U.S.C. 154(b) by 448 days.

(21) Appl. No.: 09/334,671

(22) Filed: Jun. 17, 1999

(30) Foreign Application Priority Data

Jun. 26, 1998 (CA) .................................... 2241779

(51) Int. Cl.
  *G01T 1/20* (2006.01)
(52) U.S. Cl. ..................... 250/370.14; 250/370.09; 250/370.11
(58) Field of Classification Search .......... 250/370.14, 250/370.11, 370.09
See application file for complete search history.

(56) References Cited

U.S. PATENT DOCUMENTS

| | | | |
|---|---|---|---|
| 4,230,510 A | * 10/1980 | Cusano et al. ............ 156/67 |
| 4,363,969 A | 12/1982 | Ong ........................... 250/367 |
| 4,883,956 A | * 11/1989 | Melcher et al. ......... 250/269.2 |
| 5,039,858 A | * 8/1991 | Anderson et al. ...... 250/363.03 |
| 5,132,539 A | * 7/1992 | Kwasnick et al. ...... 250/361 R |
| 5,171,998 A | 12/1992 | Engdahl et al. ........ 250/363.02 |
| 5,198,673 A | 3/1993 | Rougeot et al. ........ 250/370.11 |
| 5,396,072 A | * 3/1995 | Schiebel et al. ....... 250/370.09 |
| 5,585,638 A | 12/1996 | Hoffman ................. 250/370.07 |
| 5,596,198 A | * 1/1997 | Perez-Mendez ........ 250/370.11 |
| 5,693,947 A | * 12/1997 | Morton ................... 250/370.09 |
| 5,880,472 A | * 3/1999 | Polischuk et al. ..... 250/370.09 |
| 5,892,222 A | * 4/1999 | Elabd ....................... 250/226 |
| 6,128,362 A | * 10/2000 | Brauers et al. ............... 378/28 |

* cited by examiner

*Primary Examiner*—David Porta
*Assistant Examiner*—Shun Lee
(74) *Attorney, Agent, or Firm*—George J. Primak

(57) ABSTRACT

An x-ray image detector suitable for radiology has an active matrix substrate with scanning and read-out circuits. Over this active matrix substrate, which can be a two dimensional array of TFTs associated with a storage capacitance, there is deposited a photoreceptor made of a thin layer of amorphous selenium based multilayer structure. The photoreceptor is covered with a light-transparent electrode on top of which there is provided a scintillator. The indices of refraction of the scintillator and of the selenium based multilayer may be matched with the use of the biasing electrode.

18 Claims, 3 Drawing Sheets

INDIRECT X-RAY IMAGE DETECTOR FOR RADIOLOGY

BACKGROUND OF THE INVENTION

1. Field of the Invention

This invention relates to an indirect x-ray image detector suitable for radiology. The term "indirect" means that the x-rays are not directly converted into electrical charges, but rather they are first converted into light using a scintillator, and then light is converted into electrical charges by appropriate means. More particularly, this invention relates to an x-ray detector where the usual array of pixelated photodiodes used to convert light into electrical charges, is replaced by a photoreceptor formed of a thin uniform layer of photosensitive selenium having a multilayer structure.

2. Description of the Prior Art

It is well known to produce indirect x-ray image detectors based on a system comprising a thin film transistor (TFT) matrix deposited on a glass substrate and a corresponding array of photodiodes with an inherent capacitor, as well as an electrode connected to the source of the TFT. The photodiodes are covered with a common transparent electrode and a scintillator. Scanning circuits are connected to the lines of the TFT array while reading circuits are connected to the columns of the TFT matrix.

In such known devices, initially, all the free electrodes of the photodiodes are biased at the same reference voltage. The detector undergoes an exposure. Light is generated in the scintillator which causes the photodiodes to generate and leak charges. The associated capacitance of each photodiode releases a charge proportional to the local exposure resulting in a charge topography over the entire detector. The scanning circuits scan the lines in sequence switching the TFTs and successively connecting the free electrode of each photodiode-capacitance on the active line to the virtual reference voltage of the columns. These columns are connected to a read-out preamplifier which integrates the charge required to bring back the photodiodes to the reference potential. During the time of a line connection, the readout circuit on each line processes the integrated charges and multiplexes them to an output buffer memory where the entire two dimensional image builds up. In these arrangements, the TFTs can also be replaced by switching diodes. Such TFTs or switching diodes and photodiodes are generally made of amorphous silicon. TFTs can also be made of CdSe material. The scintillator is generally made of evaporated CsI.

One such prior art arrangement using a scintillator detector crystal, preferably made of a thallium doped cesium iodide crystal, and an array of photodiodes arranged to receive the scintillator photons, is disclosed in U.S. Pat. No. 5,171,998 of Engdahl et al., for gamma ray imaging.

Another prior art arrangement is disclosed in U.S. Pat. No. 5,198,673 of Rougeot et al. where a scintillator is optically coupled to a large area photosensor which is disposed on a substrate and is electrically coupled to a data read and reset circuit. The large area photosensor is provided with an amorphous selenium photosensitive material that exhibits avalanche multiplication gain when a selected high biasing voltage is applied, but which does not have a multilayer structure and requires a biasing voltage between 100V and 1000V to cause the photosensor to exhibit avalanche multiplication. In this patent, there is also included a protective TFT coupled to the data read and reset circuit to provide overvoltage protection from the high biasing voltage.

A further prior art detector is disclosed in U.S. Pat. No. 4,363,969 of Ong where an array of optically isolated small area scintillators overlay a duophotoconductive sandwich structure that includes a photoconductive layer which acts as a switch. Both photoconductive layers can be made of amorphous selenium. This system uses a duo-dielectric sandwich structure, but does not use an active matrix substrate such as a TFT. Also, the construction of an array of scintillators is a complex and difficult task which has not achieved widespread application.

A still further prior art x-ray detector is disclosed in U.S. Pat. No. 5,464,984 of Cox et al. It includes a scintillator, a sensor array of silicon-on-insulator substrate (SOI), processing circuits and a ceramic layer which overlays the processing circuits. No photosensitive selenium is, however, used in this patent.

Also, U.S. Pat. No. 5,585,638 of Hoffman discloses an x-ray detector assembly that comprises an imaging device formed by a scintillator in front of a two-dimensional photodetector array. The active layers are formed on a surface of substrate and a uniform first electrode layer is applied over the entire major surface on one side of the substrate and serves as a high voltage bias electrode. Then, a thin semiconductive layer which constitutes a second electrode, extends over the first electrode layer and provides an electrical characteristic that varies in response to impingement of x-rays. Again, no photosensitive selenium is used therein.

Such prior art devices present a number of disadvantages in terms of high cost and poor resolution. Also, they may be operated only by application of either high voltage or low voltage, thereby restricting their field of use.

OBJECTS AND SUMMARY OF THE INVENTION

It is the object of the present invention to provide an improvement to the known systems by replacing the array of photodiodes or other photosensors used in the prior art by a photoreceptor formed of a uniform thin layer of photosensitive selenium having a multilayer structure, which leads to many important advantages.

A further object of the invention is to have the photoreceptor multilayer structure and the scintillator enclosed in a housing providing environmental, electric and mechanical protection.

Another object is to use a multilayer structure of the n-i-p type or a p-i-n type as may be appropriate.

Other objects and advantages of the present invention will become apparent from the following description thereof.

In essence, the present invention provides an indirect x-ray image detector comprising an active matrix made, for instance, of TFT arrays or switching diodes, with scanning and read out circuits, and wherein, over said active matrix there is deposited a photoreceptor made of a thin co-planar layer (2–50 $\mu$m) of amorphous selenium based multilayer structure, said photoreceptor being covered with a light transparent biasing electrode on top of which there is provided an x-ray conversion scintillator. The indices of refraction of the scintillator and of the selenium multilayer may be suitably matched, making use of the light transparent biasing electrode.

It is preferable to enclose the selenium photosensitive multilayer photoreceptor and the scintillator within a suitable housing providing environmental, electrical and mechanical protection.

In accordance with a preferred embodiment of this invention, the active matrix is a two-dimensional array of thin film transistors (TFTs) made, for example, of amorphous silicon. Each TFT is normally associated with a storage capacitance which is usually part of the TFT architecture. Such active matrix is covered with a photoreceptor made of a photosensitive n-i-p or p-i-n multilayer structure comprising: (1) a thin (<1 µm) selenium hole blocking n-layer doped with a material such as an alkaline metal (e.g. lithium, sodium, potassium or cesium) or an oxide or halogenide of such metal; (2) an amorphous selenium i-layer doped with chlorine and arsenic and (3) a final thin (<1 µm) electron blocking p-layer of arsenic enriched amorphous selenium. On top of this multilayer structure there is placed a transparent co-planar biasing electrode, which may consist of indium tin oxide (ITO).

The i-layer of amorphous selenium doped with chlorine and arsenic may contain 1–100 ppm of chlorine and 0.1–5% by wt. of arsenic and the p-layer of arsenic enriched a-Se may contain 1–38% by wt. of arsenic. It should be pointed out that within the scope of the present invention, the hole blocking n-layer and the electron blocking player may be made of any suitable material producing the desired hole blocking and electron blocking effect, however, the middle i-layer must be made of amorphous selenium doped with chlorine and arsenic.

In the "n-i-p" structure the hole blocking n-layer is adjacent to the scintillator and the electron blocking p-layer is adjacent to the active matrix, whereas in the "p-i-n" structure the reverse is true, namely the n-layer is adjacent to the active matrix, while the p-layer is adjacent to the scintillator.

In the p-i-n arrangement, the selenium structure comprises an "n" hole blocking layer deposited on the active surface of the TFT matrix, thus making contact with conduction pads on said matrix. On the scintillator side, an electron blocking "p" layer is provided which is transparent to the light generated by the scintillator. An amorphous selenium "i" layer is sandwiched in between the "n" and the "p" layers. The top electrode is maintained herein at a negative potential with respect to the pads periodically connected to the near ground potential of the drain electrode of the TFTs. Such a structure need not be protected against high voltage discharge since the TFTs will become conducting should the pad voltage reach the negative bias of the TFT gate.

In the alternate n-i-p structure, the biasing electrode is at a positive potential. Here, a protective device should be inserted between the pad and the biasing electrode to avoid the pad potential to grow positively beyond an allowable voltage and destroy the TFT. This could happen, for instance, under severe overexposure. The voltage protection device could be made of an amorphous silicon TFT shunting the storage capacitance.

A storage capacitance is normally associated with each TFT switch, however if the selenium layer is thin enough to provide a proper charge storage, the storage capacitance will then be an integral part of such photoreceptor.

The scintillator is preferably made of a blue light emission material such as cesium iodide doped with sodium ($1 \times 10^{-4}$–$1 \times 10^{-2}$% by wt.), rather than thallium, in order to produce, under the x-ray irradiation, a color glow matching the maximum photosensitivity of the selenium. The scintillator layer may also be made of materials such as calcium tungstate, barium fluoride or sodium iodide, emitting light in the blue spectrum.

According to this invention, the role of the selenium multilayer is two-fold. Firstly, it acts as the light absorber layer thereby converting the incident energy into electrical charges proportional to the intensity level of the incident radiation. Secondly, it acts as the charge transport layer whereby the generated carriers are transported under the effect of an applied electric field to the underlying pixelated electrode. The thickness of the selenium multilayer is much less than the width of a pixel electrode so that in association with the direction of the electric field and the high intrinsic resistance of selenium, the lateral spread of charge is minimized.

The selenium based multilayer is preferably optimized for electrical transport where the dark current is below 200 $pA/cm^2$, preferably below 100 $pA/cm^2$ and the residual image is less than 5%, preferably less than 1%. This is achieved by proper control of the compositions and thicknesses of the individual layers of the photoreceptor.

Moreover, according to the present invention, the scintillator layer is preferably deposited directly onto a combined monolithic structure consisting of the biasing electrode, the co-planar selenium based multilayer photoreceptor and the active TFT matrix.

The selenium multilayer is operated under an electric field (5 to 50 V/µm) having a gain of close to 1, with no avalanche multiplication. This allows the detector to operate under very high dose rates without having to saturate the output amplifiers.

BRIEF DESCRIPTION OF THE DRAWINGS

A non-limitative embodiment of the present invention will now be described with reference to the appended drawings, in which.

DETAILED DESCRIPTION OF THE INVENTION

In the Figures, the same elements are identified by the same reference numbers.

Figure 1:
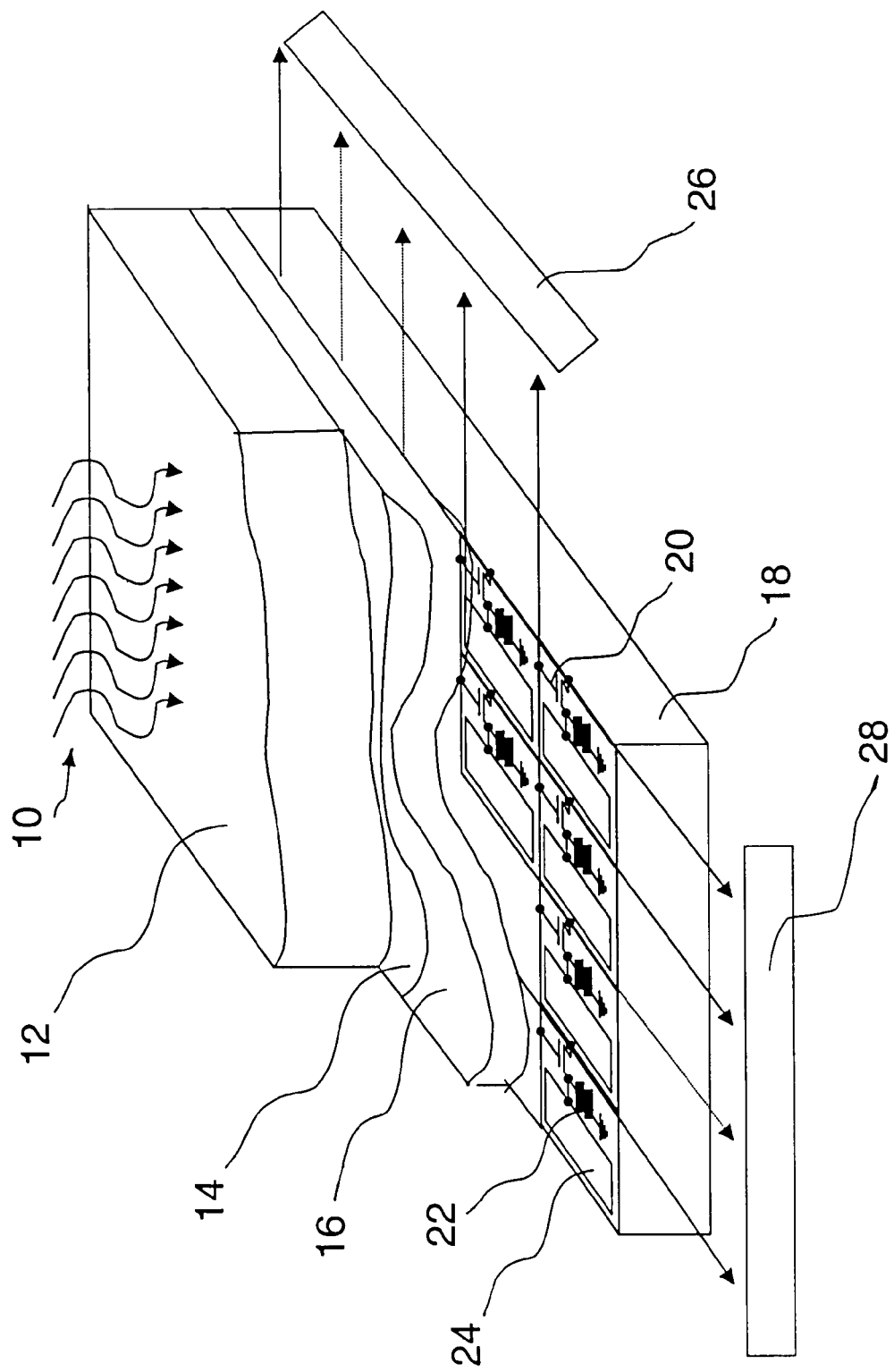
FIG. 1 is a perspective diagrammatical view of a structure of a detector in accordance with this invention.

FIG. 1 illustrates an embodiment of the present invention wherein an x-ray beam 10 is directed onto the x-ray conversion scintillator 12 which, for example, may be made of CsI. Such scintillator is typically 300–500 µm thick and it absorbs about 80%–90% of incoming radiation while converting x-rays into light. Under the scintillator 12, there is provided a light transparent top biasing electrode 14 which can be made of materials such as ITO. Under this biasing electrode 14, the present invention provides a co-planar thin (e.g. 5–20 µm) layer of photosensitive selenium based photoreceptor 16 having a multilayer structure which converts light into electrical charges. This photosensitive layer 16 is deposited onto an active matrix substrate 18 comprising arrays of TFT switches 20, storage capacitors 22 and conduction pads 24. Such TFTs may also be replaced by switching diodes (not shown).

The substrate 18 is also provided, as is known in the art, with line by line scanning circuits 26 and read out circuits 28.

It is preferable to enclose the scintillator 12 and the selenium photosensitive multilayer photoreceptor 16 as well as the biasing electrode 14, within a suitable housing (not shown) to provide environmental, electrical and mechanical protection therefor.

Figure 2:
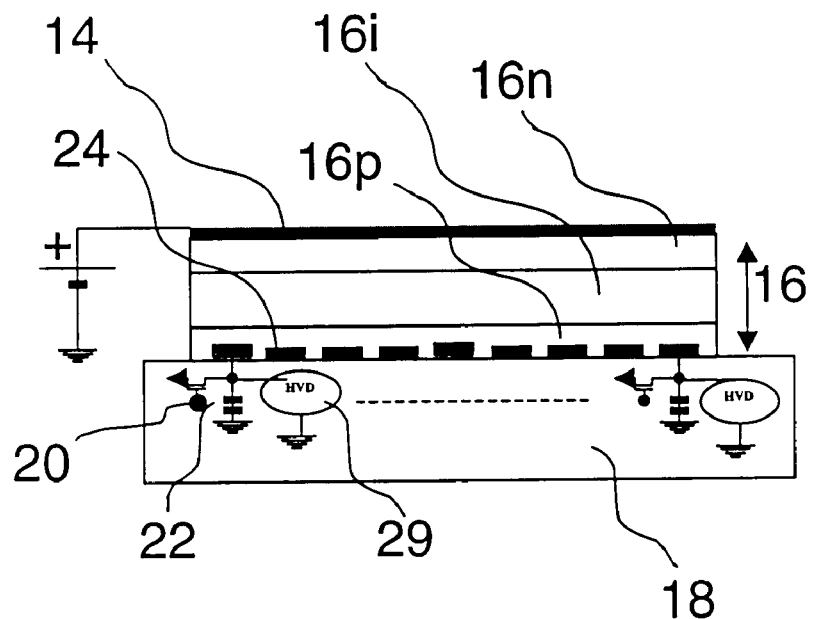
FIG. 2 is a diagrammatic side view of a n-i-p photoreceptor layer on TFT matrix, with a high voltage protection device.

FIG. 2 illustrates a n-i-p structure where the common electrode 14 is under positive bias. Here, on top of the TFT array 18 and the metal or ITO pads 24, electron blocking layer 16p made of selenium doped with arsenic and having a thickness of a few nanometers is deposited; then is provided layer 16i of several tens of microns of selenium doped with chlorine and arsenic, and finally hole blocking layer 16n having a thickness of a few nanometers, is deposited just under the electrode 14. Such n-i-p structure is provided with a protective high voltage device 29 which is inserted between the pad 24 and the biasing electrode 14 to avoid the pad potential to grow beyond an allowable voltage and destroy the TFTs. This could happen, for instance, in the event of severe overexposure.

Figure 3:
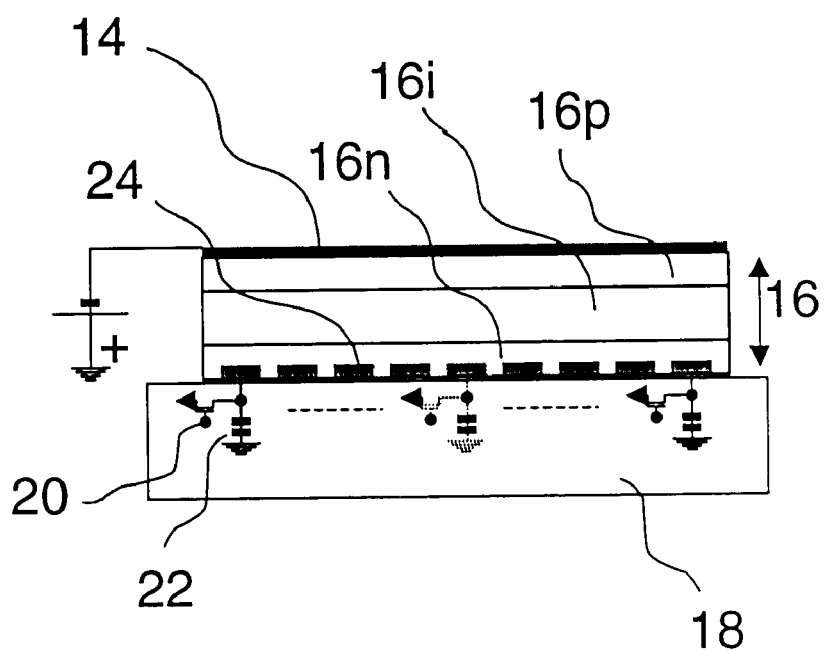
FIG. 3 is a diagrammatic side view of a p-i-n photoreceptor layer on TFT matrix, which requires no high voltage protection.

FIG. 3 illustrates a p-i-n arrangement of the selenium multilayer photoreceptor 16 on top of which there is provided the light-transparent biasing electrode 14 which is biased to a negative potential. Here the thin hole blocking layer 16n is deposited on conduction pads 24 of the active matrix substrate 18 of TFT arrays comprising TFT switch elements 20 and storage capacitors 22. The thin electron blocking layer 16p is located on the side of the biasing electrode 14 and is transparent to the light generated by the scintillator 12. These "n" and "p" layers are typically a few nanometers in thickness.

The "i" layer 16i of this p-i-n structure, which is sandwiched between the "n" and "p" layers is a thin amorphous selenium layer doped with arsenic and chlorine. The "i" layer is typically 10 to 20 $\mu$m thick. This selenium multilayer structure 16 acts as a light absorber thereby converting the incident light into electrical charges proportional to the intensity level of the incident radiation and secondly it acts as a charge transport layer whereby the generated electrical charges are transported under the effect of the applied electric field to the underlying pixelated electrode 18. The top electrode 14 is herein at a negative potential with respect to the pads 24 periodically connected to the near ground potential on the drain electrode of the TFTs. Such a structure need not be protected against high voltage discharge since the TFT 18 will become conducting should the pad 24 voltage reach the negative bias of the TFT gate.

Figure 4:
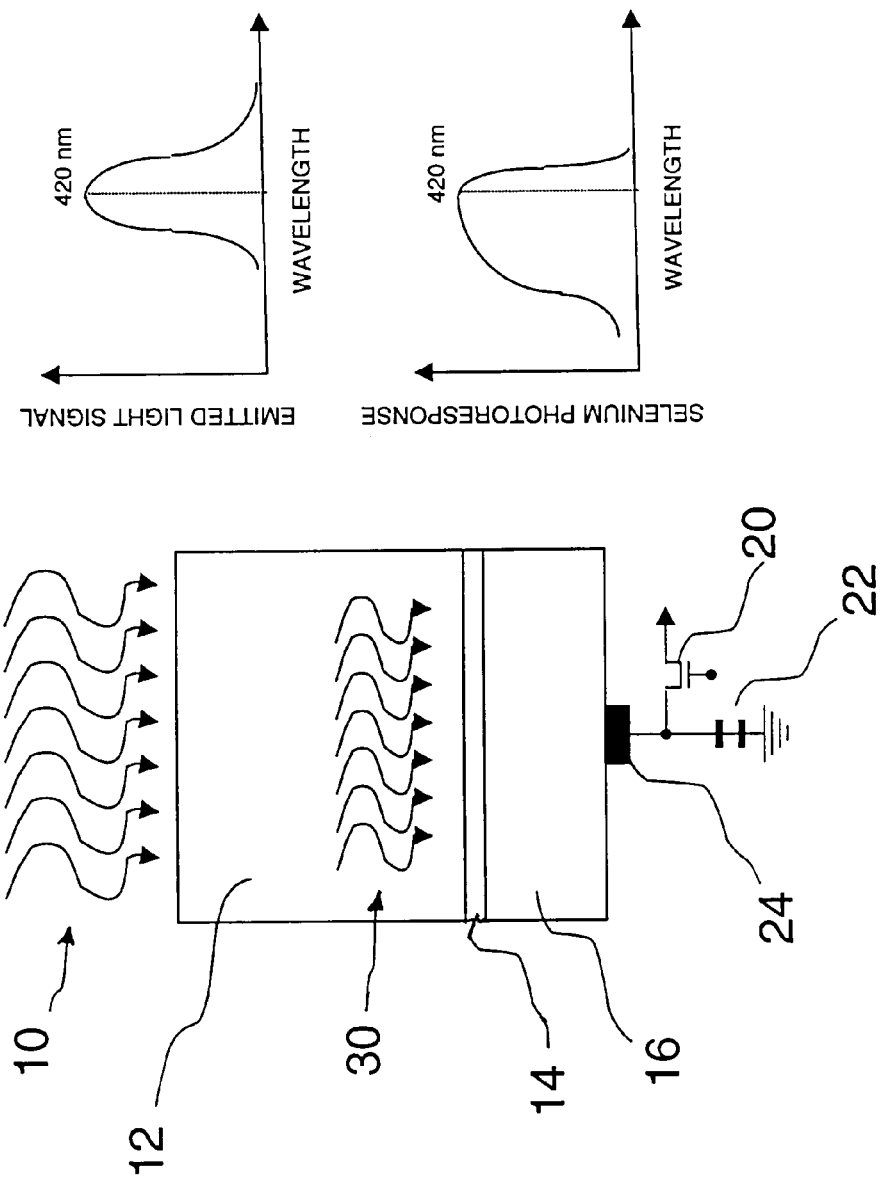
FIG. 4 is a diagrammatic view of a combination of the scintillator and a-Se photoreceptor with graphs showing the scintillator emitted light signal wavelength curve and the selenium photoresponse wavelength curve.

FIG. 4 illustrates the method of x-ray detection with a p-i-n detector structure shown in FIG. 3. As shown in this FIG. 4, the x-ray beam 10 is directed to and passes through scintillator 12 which may be made, for example, of a thick layer of cesium iodide doped with sodium, and where about 80% of incoming x-ray irradiation is absorbed, and by which the x-rays are converted into light. The light signal 30 emitted by the scintillator 12 is then passed through transparent top electrode 14 and the co-planar selenium multilayer 16 which, in this case, has a p-i-n structure. The top graph shown in FIG. 4 indicates that the peak of the light signal emitted by the scintillator is at a wavelength of 420 $\mu$m. In this case, the wavelength of the emitted light coming from the scintillator 12 is made to match the maximum photoresponse of the selenium multilayer 16.

The selenium multilayer 16 is deposited on conduction pads 24 of TFT matrix provided with TFT switching elements 20 and storage capacitors 22. Such TFT matrix may, if desired, be replaced by switching diodes.

In the case of the set-up shown in FIG. 4, in operation the top electrode 14 is placed under negative potential with respect to the pads 24 which are connected to the ground through capacitors 22. In this manner, no protection against high voltage discharge is needed since the TFT will become conducting should the pad voltage reach the negative bias of the TFT gate.

The selenium photoresponse produced by the multilayer 16, as shown in the bottom graph in FIG. 4, is matched to the wavelength peak at 420 nm, emitted by the scintillator. As a result, the output photocurrent, which is directly proportional to the emitted light signal, is optimized.

If instead of a p-i-n structure, a n-i-p structure of the selenium multilayer 16 is used, then a high voltage protective device would be required within the TFT matrix as shown in FIG. 2.

It should be noted that the invention is not limited to the specific embodiments described above, but that various obvious modifications can be made by those skilled in the art without departing from the invention and the scope of the following claims.

What is claimed is:

1. An indirect x-ray image detector suitable for radiology, comprising an active matrix substrate with scanning and read-out circuits, wherein over said active matrix substrate there is deposited a photoreceptor made of a co-planar thin layer of amorphous selenium based multilayer structure of n-i-p or p-i-n type, wherein the n-layer is a hole blocking layer, the p-layer is an electron blocking layer and the i-layer sandwiched between the n and p layers is an amorphous selenium layer doped with chlorine and arsenic and wherein each of the n and p layers is less than 1 $\mu$m in thickness, said photoreceptor being covered with a light-transparent biasing electrode on top of which there is provided an x-ray conversion scintillator.

2. An x-ray image detector according to claim 1, in which the active matrix substrate is a two dimensional array of thin film transistors (TFT) associated with a storage capacitance and having conduction pads with electric connection to the photoreceptor.

3. An x-ray image detector according to claim 2, in which the storage capacitance is a part of the TFT architecture.

4. An x-ray image detector according to claim 2, in which the storage capacitance is an integral part of the photoreceptor.

5. An x-ray image detector according to claim 2, in which the TFT are made of amorphous silicon.

6. An x-ray image detector according to claim 1, wherein the i-layer of amorphous selenium is doped with 1–100 ppm of chlorine and 0.1–5% by wt. of arsenic.

7. An x-ray image detector according to claim 1, in which the n-layer is a thin selenium layer doped with an alkaline metal or an oxide or halogenide of said metal.

8. An x-ray image detector according to claim 7, in which the alkaline metal is selected from lithium, sodium, potassium and cesium.

9. An x-ray image detector according to claim 1, in which the p-layer is a thin layer of arsenic enriched amorphous selenium.

10. An x-ray image detector according to claim 9, in which the arsenic enrichment of the p-layer is 1–38% by wt.

11. An x-ray image detector according to claim 1, in which said thickness of the multilayer structure is 5 to 20 µm.

12. An x-ray image detector according to claim 1, in which the light transparent biasing electrode is a co-planar indium tin oxide (ITO) layer positioned on top of the amorphous selenium based multilayer structure.

13. An x-ray image detector according to claim 1, in which the amorphous selenium based multilayer structure is of the p-i-n type and the light transparent biasing electrode is set to a negative potential to provide the TFT with high voltage protection.

14. An x-ray image detector according to claim 1, in which the amorphous selenium based multilayer structure is of the n-i-p type, and wherein a high voltage protective device is also provided shunting the storage capacitance.

15. An x-ray image detector according to claim 1, in which the biasing electrode also serves to match indices of refraction of the scintillator and the amorphous selenium based multilayer structure.

16. An x-ray image detector according to claim 1, in which the amorphous selenium based multilayer structure is optimized for electrical transport where dark current is below 200 pA/cm$^2$ and residual image is less than 5%.

17. An x-ray image detector according to claim 1, in which the scintillator is made of a material selected from cesium iodide doped with sodium, or from a material selected from barium fluoride, calcium tungstate and sodium iodide, emitting in the blue spectrum.

18. An x-ray image detector according to claim 1, in which the photoreceptor of the amorphous selenium based multilayer structure, the biasing electrode and the scintillator are enclosed in a housing providing environmental, electric and mechanical protection.

* * * * *